United States Patent
Hashimoto

(10) Patent No.: US 6,337,251 B1
(45) Date of Patent: Jan. 8, 2002

(54) METHOD OF MANUFACTURING SEMICONDUCTOR DEVICE WITH NO PARASITIC BARRIER

(75) Inventor: Takasuke Hashimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/538,290

(22) Filed: Mar. 29, 2000

(30) Foreign Application Priority Data

Apr. 27, 1999 (JP) .......................................... 11-119513

(51) Int. Cl.⁷ ................... H01L 21/331; H01L 21/8222
(52) U.S. Cl. ..................... 438/309; 438/337; 438/341; 438/348
(58) Field of Search .................. 438/309, 337, 438/341, 344, 345, 346, 348, 349, 359, 360, 363

(56) References Cited

U.S. PATENT DOCUMENTS

| 5,323,032 A | * | 6/1994 | Sato et al. .................. 257/198 |
| 5,391,503 A | * | 2/1995 | Miwa et al. ................. 438/349 |
| 5,424,228 A | * | 6/1995 | Imai .......................... 438/366 |
| 5,440,152 A | * | 8/1995 | Yamazaki .................... 257/197 |
| 5,494,836 A | * | 2/1996 | Imai .......................... 438/312 |
| 5,504,018 A | * | 4/1996 | Sato .......................... 438/350 |
| 5,523,245 A | * | 6/1996 | Imai .......................... 438/366 |
| 5,599,723 A | * | 2/1997 | Sato .......................... 438/320 |
| 5,643,805 A | * | 7/1997 | Ohta et al. .................. 438/362 |
| 5,698,890 A | * | 12/1997 | Sato .......................... 257/592 |
| 5,882,976 A | * | 3/1999 | Blair .......................... 438/309 |
| 5,895,248 A | * | 4/1999 | De Boer et al. ............. 438/341 |
| 5,897,359 A | * | 4/1999 | Cho et al. ................... 438/312 |
| 5,962,880 A | * | 10/1999 | Oda et al. .................... 257/198 |
| 6,117,744 A | * | 9/2000 | Ammo ........................ 438/309 |
| 6,228,166 B1 | * | 5/2001 | Suzuki et al. ................. 117/94 |

FOREIGN PATENT DOCUMENTS

| JP | 5-160142 A | * | 6/1993 | ......... H01L/21/331 |
| JP | 7-147287 | | 6/1995 | |
| JP | 8-83805 | | 3/1996 | |
| JP | 10-79394 | | 3/1998 | |
| JP | 10-92837 A | * | 4/1998 | ... H01L/21/331 .. |

* cited by examiner

Primary Examiner—Matthew Smith
Assistant Examiner—Lex H. Malsawma
(74) Attorney, Agent, or Firm—McGinn & Gibb, PLLC

(57) ABSTRACT

In a method of manufacturing a semiconductor device, a first insulating film is formed on a semiconductor substrate, a first conductive film is formed on the first insulating film, and a second insulating film is formed on the first conductive film. An opening is formed to the semiconductor substrate through the second insulting film, the first conductive film and the first insulting film to expose a portion of a surface of the semiconductor substrate and a portion of a surface of the first conductive film. The exposed surface portion of the first conductive film is covered by a covering film. Thermal treatment is carried out to clean the exposed surface portion of the semiconductor substrate. A spacer film is formed in the opening on the exposed surface portion of the semiconductor substrate, and then the covering film is removed. Subsequently, an electrode film is formed on the spacer film.

20 Claims, 6 Drawing Sheets

METHOD OF MANUFACTURING SEMICONDUCTOR DEVICE WITH NO PARASITIC BARRIER

BACKGROUND OF THE INVENTION

1. Field of the Invention

The present invention relates to a method of manufacturing a semiconductor device and, more particularly, a method of manufacturing a semiconductor device with no parasitic barrier.

2. Description of the Related Art

The high speed operation of a bipolar transistor is demanded. In a SiGe base bipolar transistor using a SiGe layer as a base layer, boron forms a parasitic barrier in the boundary between a collector and a base to obstruct the high speed operation. When the base layer is formed of a silicon layer, such a problem is not caused. However, when the SiGe layer is used as the base layer, the parasitic barrier is generated.

A technique for restraining the generation of such a parasitic barrier is known in Japanese Laid Open Patent Application (JP-A-Heisei 10-79394). According to this conventional technique, as shown in FIG. 1A, an oxide film 2 is formed on a silicon substrate 1. A boron doped polysilicon film 3 is formed on the oxide film 2. An insulating film 4 is formed on the polysilicon film 3. Subsequently, an emitter contact opening 5 is formed in the insulating film 4, the boron doped polysilicon film 3, and the oxide film 2. Then, an oxide film 2 is further removed to the lateral direction by a wet etching. After the exposed surface formed in this way is subjected to APM rinse, a high temperature thermal treatment (flashing process) is performed in an epitaxial growth unit to remove impurities from the surface. Thus, the surface 6 of the silicon substrate 1 is cleaned.

Next, as shown in FIG. 1B, a SiGe spacer layer 7 in which boron is not doped is formed on the surface 6. Then, a boron doped SiGe base layer 8 is formed on the SiGe spacer layer 7 such that the boron doped SiGe base layer 8 is connected to the boron doped polysilicon film 3.

Next, a wafer is taken out from the epitaxial growth unit. Subsequently, as shown in FIG. 1C, after side walls 9 are formed, a polysilicon film 11 is formed on the boron doped SiGe base layer 8. Thus, an emitter region 18 is formed.

The transistor having the SiGe spacer layer 7 should not have a parasitic barrier theoretically. Therefore, if the cutoff frequency $f_T$ as the index of an AC characteristic of the bipolar transistor is designed to 60 GHz, the cutoff frequency $f_T$ should become 60 GHz in accordance with the theory. However, the cutoff frequency $f_T$ of the actually manufactured bipolar transistor was only 20 GHz.

In conjunction with the above description, a semiconductor device is disclosed in Japanese Laid Open Patent Application (JP-A-Heisei 7-147287). In this reference, a bipolar transistor having a base layer and a collector layer which are composed of single crystal silicon containing Ge. The base layer (10) has a distribution in which the concentration of Ge is low on the side of the emitter layer (13) and is high on the side of the collector layer (3A). The collector layer has a distribution in which the concentration of Ge is high on the side of the base layer and is low on the side of the high concentration pad layer 2 inside the collector. Moreover, the Ge concentration in the collector layer decreases rapidly on the side of the base layer and decreases gently on the side of the pad layer. Thus, the drift electric field of the silicon hetero junction bipolar transistor which has the SiGe base and the SiGe collector is improved, the mobility of the carrier in the base layer is improved and the generation of the parasitic barrier is restrained in the base collector junction area.

Also, a semiconductor device is disclosed in Japanese Laid Open Patent Application (JP-A-Heisei 8-83805). In this reference, a P-type base electrode polysilicon film (7) is formed on a silicon oxide film (6) to protrude in an opening (101). An undoped single crystal $Si_{0.9}Ge_{0.1}$ layer (10), a $P^+$-type single crystal $Si_{0.9}Ge_{0.1}$ layer (11) and an $N^+$-type single crystal emitter (16) are formed on a silicon collector layer (3) in the opening (101). Each of the single crystal $Si_{0.9}Ge_{0.1}$ layer (10) and the single crystal $Si_{0.9}Ge_{0.1}$ layer (11) has a trapezoidal section in which the film thickness of a portion situated under the polysilicon film (7) is thinner than the film thickness of the other portion. Also, the $P^+$-type single crystal silicon layer 12 has the film thickness of a portion situated under the polysilicon (7) is thicker than the film thickness of the other portion, and contacts the polysilicon film (7) through the polycrystal film (13). In this way, the degradation of junction characteristic is restrained.

SUMMARY OF THE INVENTION

An object of the present invention is to provide a method of manufacturing a semiconductor device in which the generation of a parasitic barrier can be prevented.

In order to achieve an aspect of the present invention, a method of manufacturing a semiconductor device, is attained by forming a first insulating film on a semiconductor substrate, by forming a first conductive film on the first insulating film, by forming a second insulating film on the first conductive film, by forming an opening to the semiconductor substrate through the second insluting film, the first conductive film and the first insulting film to expose a portion of a surface of the semiconductor substrate and a portion of a surface of the first conductive film, by covering the exposed surface portion of the first conductive film by a covering film, by carrying thermal treatment to clean the exposed surface portion of the semiconductor substrate, by forming a spacer film in the opening on the exposed surface portion of the semiconductor substrate, by removing the covering film, and by forming an electrode film on the spacer film.

Here, in order to cover the exposed surface portion of the first conductive film, there may be performed a step of forming third insulating film on the exposed surface portion of the semiconductor substrate, a step of forming a fourth insulating film on the exposed surface portion of the first conductive film, and a step of removing the third insulating film and a part of the fourth insulating film, a remaining portion of the fourth insulating film functioning as the covering film. In this case, the fourth insulating film is thicker than the third insulating film. Also, the exposed surface portion of the semiconductor substrate may be oxidized to form the third insulating film and the exposed surface portion of the first conductive film may be oxidized to form the fourth insulating film. Also, wet etching may be carried out to the third and fourth insulating films. At this time, the third insulating film having an etching rate larger than the fourth insulating film. Thus, the third insulating film and a part of the fourth insulating film may be removed.

Also, the thermal treatment may be carried out at a temperature of 800° C. or above to clean the exposed surface portion of the semiconductor substrate.

Also, the first conductive film may be a boron-doped p-type conductive film, the spacer film may be a SiGe film, and the electrode film may be a boron-doped SiGe base film.

In order to achieve another aspect of the present invention, a method of manufacturing a semiconductor device, is attained by forming an opening to a semiconductor substrate through a first insulting film, and a boron-doped polysilicon film to expose a portion of a surface of the semiconductor substrate and a portion of a surface of the boron-doped emitter film, by forming a non-doped SiGe spacer film in the opening on the exposed surface portion of the semiconductor substrate without contamination by boron emitted from the polysilicon film, and by forming a boron-doped intrinsic base film on the spacer film.

In the step of forming a non-doped SiGe spacer film, the exposed surface portion of the semiconductor substrate is rinsed and thermal treatment is carried out while preventing the emission of boron from the polysilicon film. In this case, the thermal treatment may be carried out at a temperature of 800° C. or above.

Also, in the step of forming a non-doped SiGe spacer film, the exposed surface portion of the boron-doped polysilicon film may be covered by a covering film. In this case, a second insulating film is formed on the exposed surface portion of the semiconductor substrate, a third insulating film is formed on the exposed surface portion of the polysilicon film, and the second insulating film and a part of the third insulating film are removed. A remaining portion of the third insulating film functions as the covering film. Also, the fourth insulating film is thicker than the third insulating film.

Also, in the step of forming a boron-doped intrinsic base film includes removing the covering film.

DESCRIPTION OF THE PREFERRED EMBODIMENTS

Hereinafter, a method of manufacturing a semiconductor device of the present invention will be described below in detail with reference to the attached drawings.

The inventor of the present invention considered and examined that any cause of untheoretical operation of a bipolar transistor was in a condition of a flashing process or wash liquid used in the flashing process. As a result, it was found that there was no problem in the condition of the flashing process and the wash liquid used in the flashing process. Accordingly, the inventor further studied and examined the various processes of the manufacturing the bipolar transistor and found the following fact as the result of the examination. That is, when the surface of a semiconductor wafer is subjected to the thermal treatment in the high temperature of 800° C. or above in the epitaxial growth unit, the boron ions contained in the boron doped polysilicon film 3 rushes out of the film 3 and adheres to the surface 6 of the silicon substrate 1 to pollute the surface 6 in a high concentration. A collector-base junction is formed outside from the SiGe/Si boundary because of such pollution. Thus, the generation of the parasitic barrier can not be prevented. Consequently, the generation of such a parasitic barrier causes the decrease of the cutoff frequency $f_T$.

FIGS. 2A to 2I are cross sectional views showing the method of manufacturing the semiconductor device according to an embodiment of the present invention.

Figure 2A:
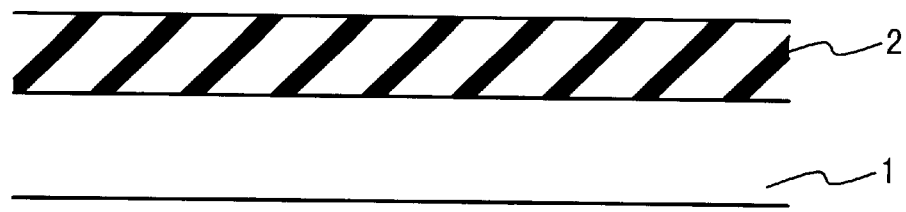
FIGS. 2A to 2I are cross sectional views shows a method of manufacturing a semiconductor device according to an embodiment of the present invention.

Referring to FIG. 2A, first, an insulating oxide film 2 is formed on a silicon substrate 1 to have the film thickness of 400Å or below.

Figure 2B:
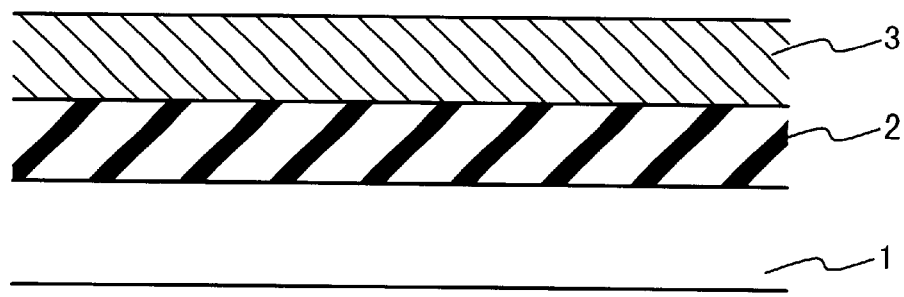
Figure 2C:
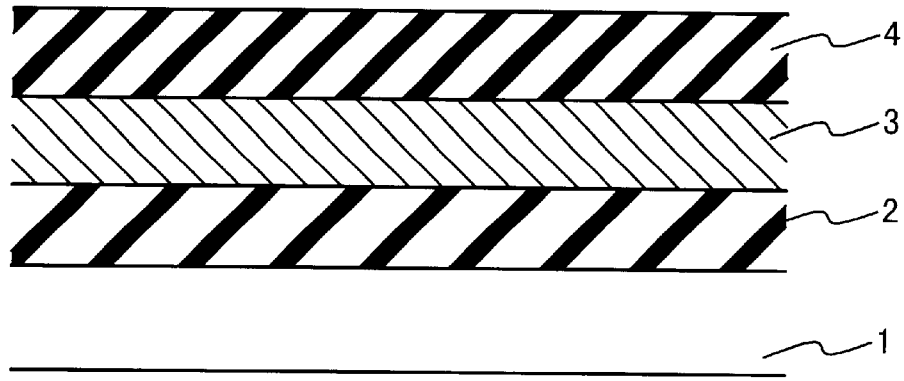

Next, as shown in FIG. 2B, a boron doped polysilicon film 3 is formed on the insulating oxide film 2. The boron doped polysilicon film 3 is formed as a base electrode. Subsequently, as shown in FIG. 2C, an insulating film 4 is formed on the boron doped polysilicon film 3.

Figure 2D:
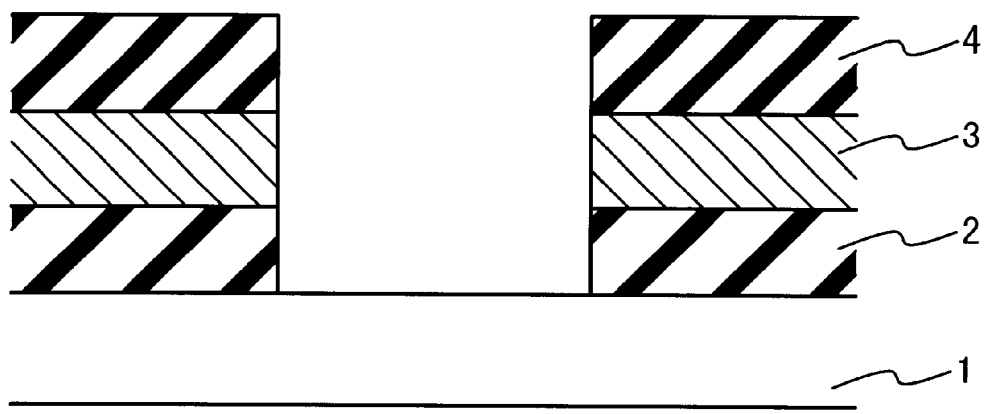
Figure 2E:
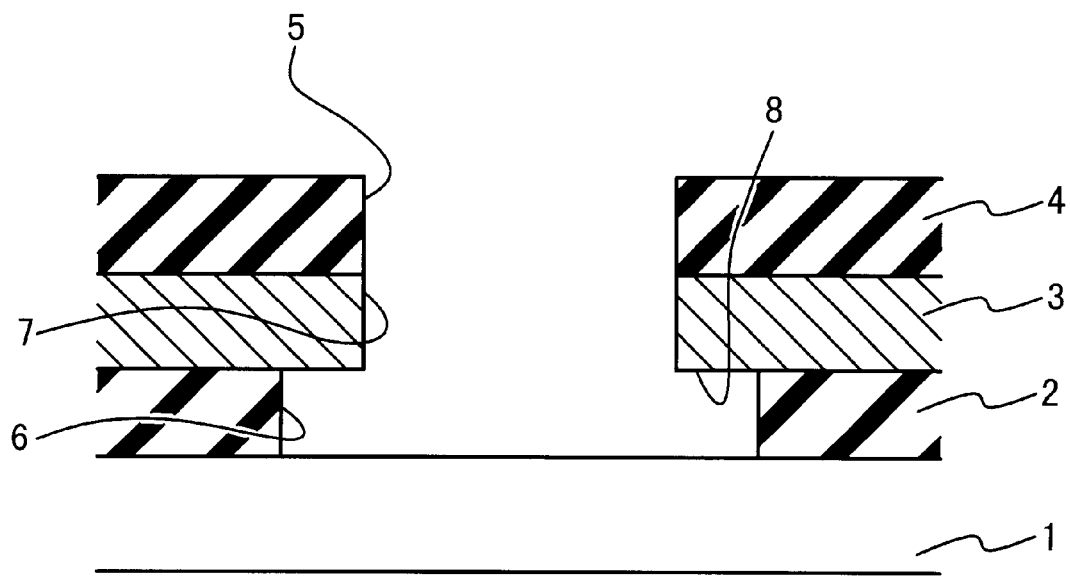

Next, as shown in FIG. 2D, the insulating film 4, the boron doped polysilicon film 3, and the insulating oxide film 2 are partially removed or etched to form an emitter contact opening 5. Subsequently, as shown in FIG. 2E, only the insulating oxide film 2 is removed to the lateral direction by a wet etching method. As a result, a part of the surface of the substrate is exposed. Also, the side surface and under surface of the boron doped polysilicon film 3 are exposed.

Figure 2F:
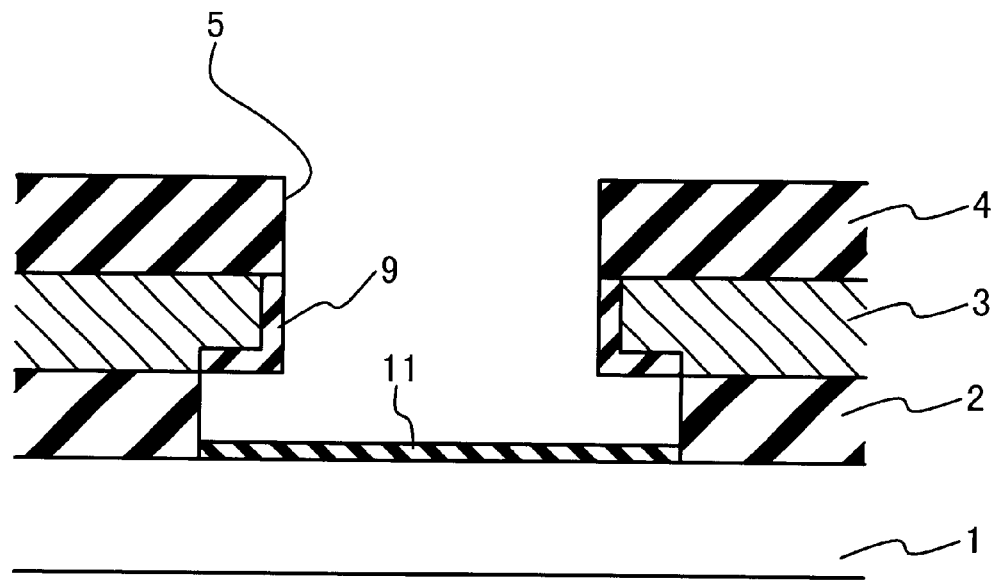

Next, an oxidizing process is carried out to the side wall surfaces 7 of the emitter contact opening 5 and underside surfaces 8 of the boron doped polysilicon film 3 in the contact opening 5. As a result, as shown in FIG. 2F, a first oxide covering layer 9 is formed on the exposed surfaces of the boron doped polysilicon film 3 to have the film thickness of about 100 Å.

At this time, a second oxide covering layer 11 is formed on the exposed surface of the silicon substrate 1. The first oxide covering layer 9 is formed thicker than the second oxide covering layer 11. The second oxide covering layer 11 is formed to have the film thickness of 50 Å. The first oxide covering layer 9 is formed by oxidizing the boron doped polysilicon film 3 in which boron ions are doped in a high concentration. The first oxide covering layer 9 is low in the etching rate with hydrofluoric acid, compared with the second oxide covering layer 11. Using the low etching rate, the second oxide covering layer 11 is removed in the wet etching with hydrofluoric acid, as shown in FIG. 2F. As a result, the first oxide covering layer 9 is left. The first oxide covering layer 9 has the etching rate lower than that of the second oxide covering layer 11 and is formed thicker than the second oxide covering layer 11. The first oxide covering layer 9 is etched at the same time when the second oxide covering layer 11 is etched. However, when the etching of the second oxide covering layer 11 is ended, the first oxide covering layer 9 still has an enough film thickness.

Figure 2G:
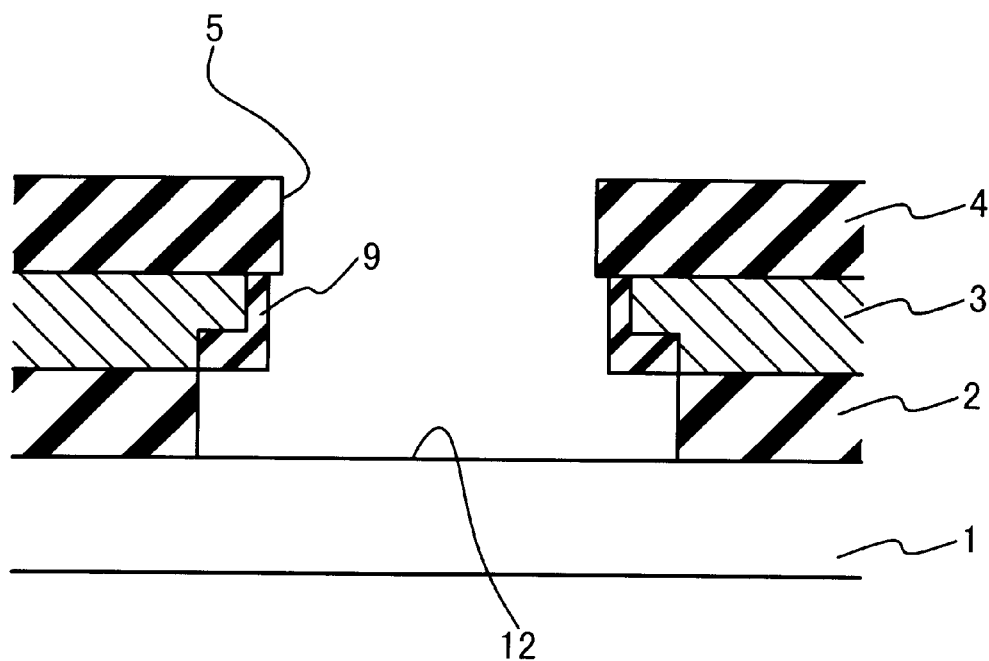

After the exposed surfaces are subjected to APM rinsing (rinsing with ammonia and hydrogen peroxide), the substrate is moved into the epitaxial growth unit (not shown) and a high temperature thermal treatment is carried out. The high temperature thermal treatment, which is also referred to as the flashing process, is carried out at a temperature of about 800° C. or above for about one minute under a high vacuum condition. The purge of contamination from the exposed surface 12 of the silicon substrate 1 is carried out through the high temperature thermal treatment, as shown in FIG. 2G. During the high temperature thermal treatment, the boron doped polysilicon film 3 is completely covered by the first oxide covering layer 9. As a result, the boron ions never rush out from the boron doped polysilicon film 3.

Figure 2H:
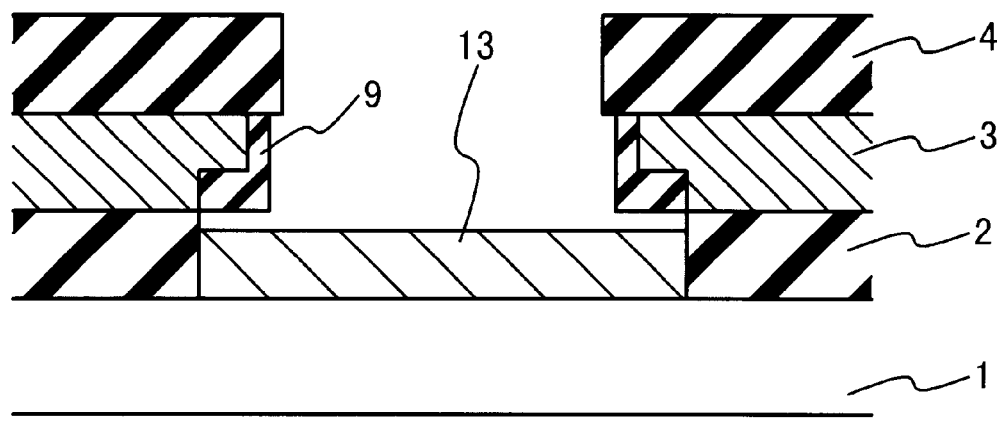

Next, as shown in FIG. 2H, a SiGe spacer layer 13 is formed on the exposed surface of the silicon substrate 1 in the above mentioned epitaxial growth unit. The boron ions are not doped in the SiGe spacer layer 13. Then, the first oxide covering layer 9 is removed.

Figure 1A:
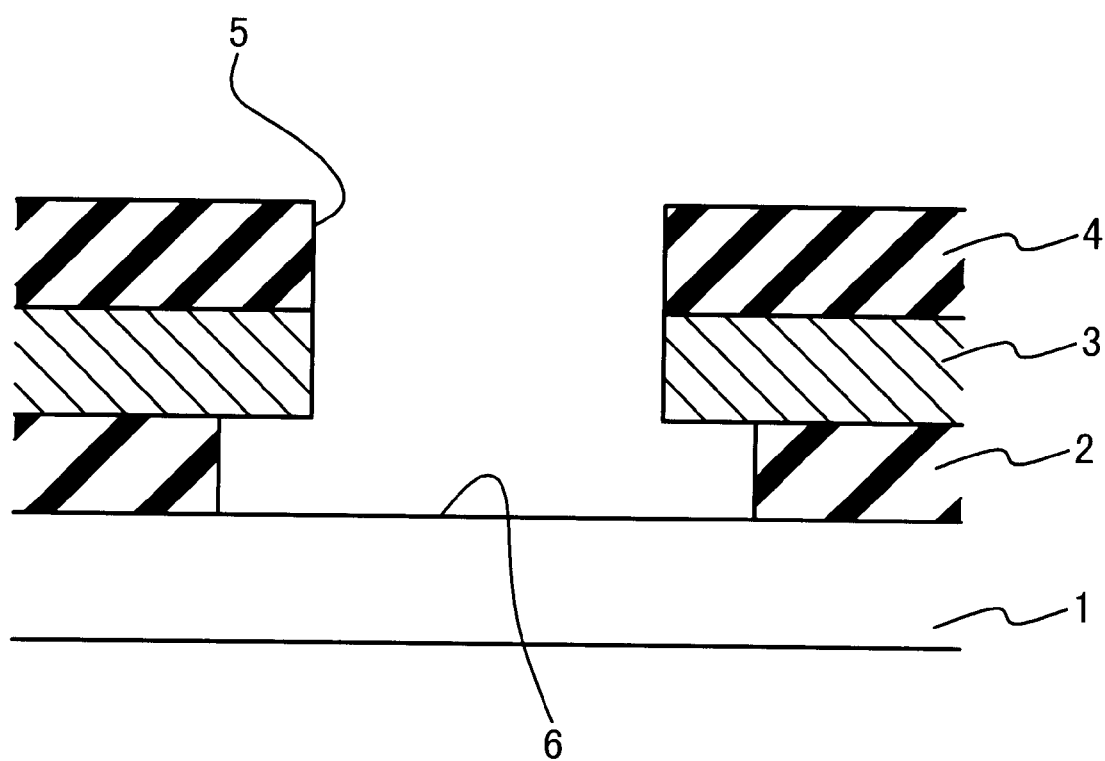
FIGS. 1A to 1C are cross sectional views shows a conventional method of manufacturing a semiconductor device.
Figure 1B:
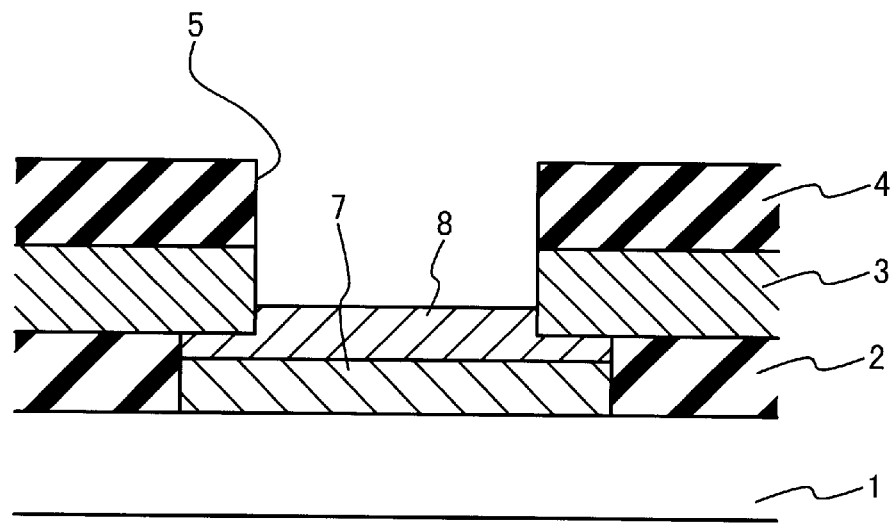
Figure 1C:
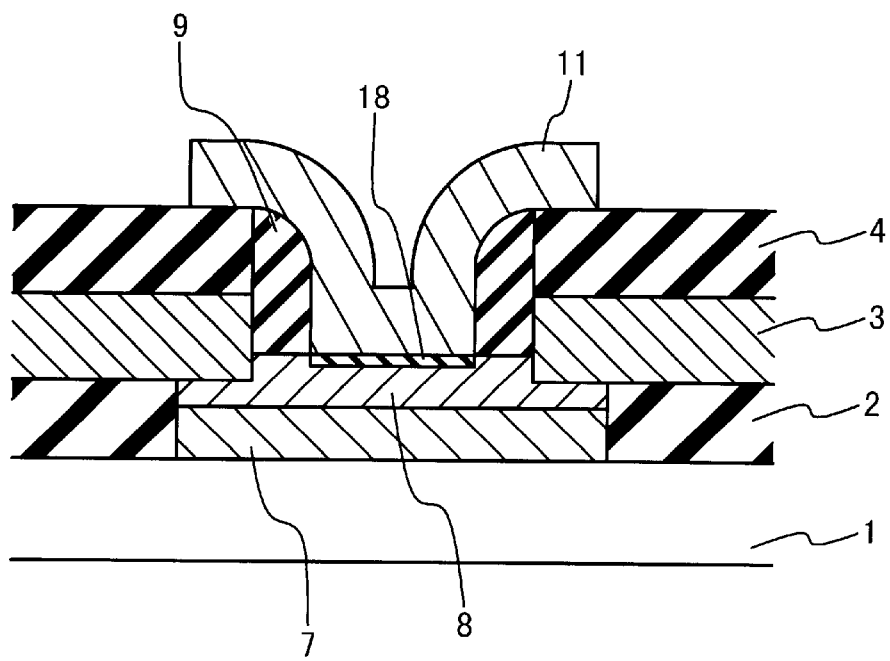
Figure 2I:
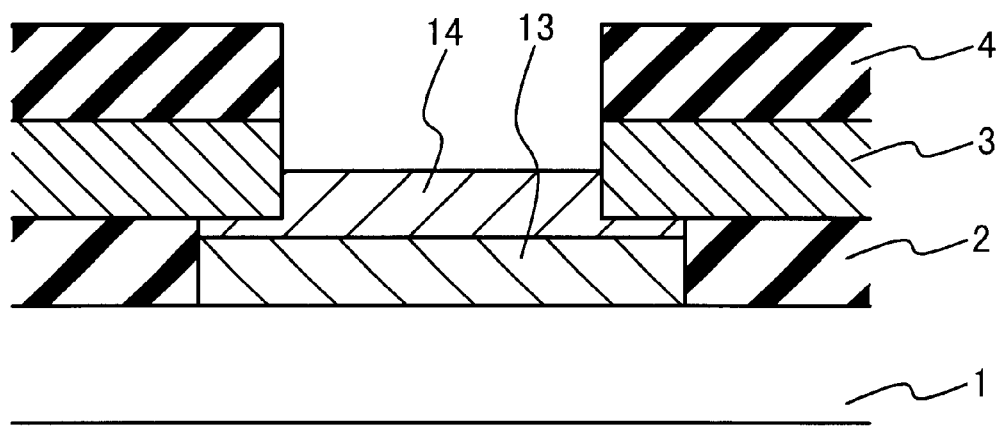

Next, as shown in FIG. 2I, a SiGe base layer (an intrinsic base layer) 14 is formed on the SiGe spacer layer 13. Boron ions are doped in the SiGe base layer 14. Thus, the SiGe base layer 14 and the boron doped polysilicon layer 3 are connected. Thereafter, the same process as shown in FIG. 1C is carried out to form an emitter region and an emitter electrode.

As shown in FIG. 2G, during high temperature thermal treatment, the boron doped polysilicon film is covered by the first oxide covering layer 9 so that the boron ions never rush out from the boron doped polysilicon film 3. Therefore, the surface 12 can be avoided from boron pollution. Thus, the collector-base junction is never formed outside from the SiGe/Si boundary. Also, the generation of a parasitic barrier can be prevented. As a result, the decrease of the cutoff frequency $f_T$ can be prevented so that a desired transistor characteristic can be attained.

As described above, according to the method of manufacturing the semiconductor device of the present invention, the silicon substrate surface can be avoided from the boron pollution.

What is claimed is:

1. A method of manufacturing a semiconductor device, comprising:

forming a first insulating film on a semiconductor substrate;

forming a first conductive film on said first insulating film;

forming a second insulating film on said first conductive film;

forming an opening to said semiconductor substrate through said second insulating film, said first conductive film and said first insulating film to expose a portion of a surface of said semiconductor substrate and a portion of a surface of said first conductive film;

covering said exposed surface portion of said first conductive film by a covering film;

carrying out thermal treatment to clean said exposed surface portion of said semiconductor substrate;

forming a spacer film in said opening on said exposed surface portion of said semiconductor substrate;

removing said covering film; and forming an electrode film on said spacer film.

2. A method according to claim 1, wherein said covering comprises:

forming a third insulating film on said exposed surface portion of said semiconductor substrate;

forming a fourth insulating film on said exposed surface portion of said first conductive film; and removing said third insulating film and a part of said fourth insulating film, a remaining portion of said fourth insulating film functioning as said covering film.

3. A method according to claim 2, wherein said fourth insulating film is thicker than said third insulating film.

4. A method according to claim 2, wherein said forming a third insulating film comprises:

oxidizing said exposed surface portion of said semiconductor substrate, and wherein said forming a fourth insulating film includes:

oxidizing said exposed surface portion of said first conductive film.

5. A method according to claim 2, wherein said removing said third insulating film and a part of said fourth insulating film comprises:

carrying wet etching to said third and fourth insulating films, said third insulating film having an etching rate larger than said fourth insulating film.

6. A method according to claim 1, wherein said carrying comprises:

carrying out said thermal treatment at a temperature of 800° C. or above to clean said exposed surface portion of said semiconductor substrate.

7. A method according to claim 1, wherein said first conductive film comprises a boron-doped p-type conductive film, said spacer film comprises a SiGe film, and said electrode film comprises a boron-doped SiGe base film.

8. A method of manufacturing a semiconductor device, comprising:

forming an opening to a semiconductor substrate through a first insulating film, and a boron-doped polysilicon film to expose a portion of a surface of said semiconductor substrate and a portion of a surface of said boron-doped polysilicon film;

covering said exposed surface portion of said boron-doped polysilicon film with a covering film;

forming a non-doped SiGe spacer film in said opening on said exposed surface portion of said semiconductor substrate; and forming a boron-doped intrinsic base film on said spacer film.

9. A method according to claim 8, wherein said forming a non-doped SiGe spacer film comprises:

rinsing said exposed surface portion of said semiconductor substrate; and carrying out thermal treatment while preventing the emission of boron from said polysilicon film.

10. A method according to claim 9, wherein said carrying out thermal treatment comprises:

carrying out said thermal treatment at a temperature of 800° C. or above.

11. A method according to claim 8, wherein said covering said exposed surface portion of said boron-doped polysilicon comprises:

oxidizing sidewall surfaces of said opening and underside surfaces of said boron-doped polysilicon film.

12. A method according to claim 11, wherein said forming a boron-doped intrinsic base film comprises:

removing said covering film.

13. A method according to claim 8, wherein said covering said exposed surface portion of said boron-doped polysilicon film comprises:

forming a second insulating film on said exposed surface portion of said semiconductor substrate;

forming a third insulating film on said exposed surface portion of said polysilicon film; and removing said second insulating film and a part of said third insulating film, a remaining portion of said third insulating film functioning as said covering film.

14. A method according to claim 13, wherein said third insulating film is thicker than said second insulating film.

15. A method according to claim 8, wherein said covering film prevents a migration of boron from said boron-doped polysilicon film.

16. A method according to claim 8, wherein said covering film has a thickness of about 100 Å.

17. A method according to claim 8, wherein said covering film prevents a formation of a collector-base junction at a boundary between said SiGe spacer film and said semiconductor substrate.

18. A method according to claim 8, wherein said covering film prevents a formation of a parasitic barrier.

19. A method according to claim 8, wherein said semiconductor device comprises a bipolar transistor.

20. A method according to claim 8, further comprising:

forming an emitter region in said boron-doped intrinsic base film; and forming an emitter electrode on said emitter region.

* * * * *